United States Patent
Zhuo et al.

(10) Patent No.: US 11,258,278 B2
(45) Date of Patent: Feb. 22, 2022

(54) DETECTION CIRCUIT AND METHOD

(71) Applicant: Contemporary Amperex Technology Co., Limited, Ningde (CN)

(72) Inventors: Jianwei Zhuo, Ningde (CN); Le Chu, Ningde (CN); Jirong Huo, Ningde (CN); Yanhui Fu, Ningde (CN); Qiandeng Li, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 168 days.

(21) Appl. No.: 16/799,729

(22) Filed: Feb. 24, 2020

(65) Prior Publication Data
US 2020/0274374 A1 Aug. 27, 2020

(30) Foreign Application Priority Data
Feb. 25, 2019 (CN) .......................... 201910138988.0

(51) Int. Cl.
*H02J 7/00* (2006.01)
*G01R 19/165* (2006.01)

(52) U.S. Cl.
CPC ............ *H02J 7/0031* (2013.01); *H02J 7/007* (2013.01); *G01R 19/16542* (2013.01)

(58) Field of Classification Search
USPC ....................................................... 320/134
See application file for complete search history.

(56) References Cited

U.S. PATENT DOCUMENTS

2007/0285102 A1  12/2007 Muller
2011/0084705 A1   4/2011 Kawamura
2013/0176042 A1   7/2013 Huh
(Continued)

FOREIGN PATENT DOCUMENTS

CN    104020421 A    9/2014
CN    103048545 B    4/2016
(Continued)

OTHER PUBLICATIONS

Chinese First Office Action dated Aug. 12, 2020, Patent Application No. 201910138988.0, filed Feb. 25, 2019, 9 pages.
(Continued)

*Primary Examiner* — Mohammed Alam
(74) *Attorney, Agent, or Firm* — Davis Wright Tremaine, LLP

(57) ABSTRACT

The present disclosure discloses a detection circuit and method. The detection circuit comprises: a controller, a battery pack, a main positive switch module, a main negative switch module and at least one detection loop. The controller collects voltages of a positive electrode and a negative electrode of the battery pack and a voltage between external sides of the main positive switch module and the main negative switch module when turning on the main positive or negative switch module and after turning on any detection loop, and obtains resistance values of insulation resistors of the external sides according to resistance values of insulation resistors of internal sides of the main positive and negative switch module, as well as the voltages of the positive electrode and the negative electrode and the voltage between the external sides of the main positive switch module and the main negative switch module, which are collected twice.

14 Claims, 8 Drawing Sheets

(56) References Cited

U.S. PATENT DOCUMENTS

| | | | |
|---|---|---|---|
| 2013/0300430 A1 | 11/2013 | Lindsay et al. | |
| 2016/0154064 A1 | 6/2016 | Klein et al. | |
| 2017/0160334 A1* | 6/2017 | Kawanaka | B60L 58/15 |
| 2018/0022218 A1* | 1/2018 | Watanuki | G01R 31/006 |
| | | | 324/503 |
| 2018/0231610 A1 | 8/2018 | Zhou | |
| 2018/0278067 A1* | 9/2018 | Mizoguchi | H02J 7/0021 |
| 2019/0260095 A1* | 8/2019 | Machida | H01M 10/48 |
| 2020/0274374 A1* | 8/2020 | Zhuo | G01R 31/52 |
| 2021/0141023 A1* | 5/2021 | Gunji | H02J 7/0045 |

FOREIGN PATENT DOCUMENTS

| | | |
|---|---|---|
| CN | 103869179 B | 12/2016 |
| CN | 207181530 U | 4/2018 |
| CN | 109100618 A | 12/2018 |
| CN | 208239523 U | 12/2018 |
| CN | 109212385 A | 1/2019 |
| CN | 109564266 A | 4/2019 |
| KR | 20150084532 A | 7/2015 |
| WO | 2018139830 A1 | 8/2018 |

OTHER PUBLICATIONS

Extended European Search Report dated Jul. 24, 2020, European Patent Application No. 20159222.7, filed Feb. 25, 2020, 7 pages.
International Search Report and Written Opinion dated May 28, 2020, in International Patent Application No. PCT/CN2020/076601, filed Feb. 25, 2020, 5 pages.

* cited by examiner

DETECTION CIRCUIT AND METHOD

CROSS-REFERENCE TO RELATED APPLICATIONS

This application claims the priority benefit of Chinese Patent Application No. 201910138988.0 filed on Feb. 25, 2019, the entire content of which is incorporated herein by reference.

TECHNICAL FIELD

Embodiments of the present disclosure relate to circuit technology, and more particularly, to a detection circuit and method.

BACKGROUND

With the development of a battery technology, the replacement of fuel vehicles with electric vehicles has become a trend in an automotive industry. A power battery pack is a key component of the electric vehicles, two sides of a relay of the electric vehicle are grounded separately, and an insulation performance of the electric vehicle is detected when the relay is turned on, to ensure safety of power supply under high voltage.

At present, how to detect an insulation performance of a single side or both sides of a relay is a problem to be solved.

SUMMARY

An objective of the present disclosure is to provide a detection circuit and method, which can detect an resistance values of an insulation resistor of an external side of a main positive switch module to a reference potential terminal and an resistance values of an insulation resistor of an external side of a main negative switch module to the reference potential terminal, to obtain insulation performance of the external sides of the main positive switch module and the main negative switch module, so as to avoid dangerous contact.

In order to solve the above-described technical problem, an embodiment of the present disclosure provides a detection circuit, including: a controller, a battery pack, a main positive switch module, a main negative switch module and at least one detection loop. Herein, both sides of the main positive switch module and both sides of the main negative switch module are connected with a reference potential terminal respectively, and one side of the main positive switch module and/or one side of the main negative switch module are/is connected with the reference potential terminal through the at least one detection loop. A positive electrode of the battery pack is connected with an internal side of the main positive switch module, and a negative electrode of the battery pack is connected with an internal side of the main negative switch module. The controller is configured to turn on the main positive switch module or the main negative switch module when the detection circuit is in an initial state, collect voltages of the positive electrode and the negative electrode of the battery pack and a voltage between the external side of the main positive switch module and the external side of the main negative switch module, and re-collect voltages of the positive electrode and the negative electrode of the battery pack and a voltage between the external side of the main positive switch module and the external side of the main negative switch module after any detection loop is turned on. The initial state is a state in which the main positive switch module, the main negative switch module, and the respective detection loops are all in a turned-off state. The controller is further configured to obtain resistance values of insulation resistors of the external sides of the main positive switch module and the main negative switch module, according to resistance values of insulation resistors of the internal sides of the main positive switch module and the main negative switch module, as well as the voltages of the positive electrode and the negative electrode of the battery pack and the voltage between the external side of the main positive switch module and the external side of the main negative switch module, which are collected twice.

An embodiment of the present disclosure further provides a detection method, applied to the above-described detection circuit. The method includes: turning on a main positive switch module or a main negative switch module when the detection circuit is in an initial state, collecting voltages of a positive electrode and a negative electrode of a battery pack and a voltage between an external side of the main positive switch module and an external side of the main negative switch module, where, the initial state is a state in which the main positive switch module, the main negative switch module and respective detection loops are all in a turned-off state; turning on any detection loop, re-collecting voltages of the positive electrode and the negative electrode of the battery pack and a voltage between the external side of the main positive switch module and the external side of the main negative switch module; and obtaining resistance values of insulation resistors of the external sides of the main positive switch module and the main negative switch module, according to resistance values of insulation resistors of internal sides of the main positive switch module and the main negative switch module, as well as the voltages of the positive electrode and the negative electrode of the battery pack and the voltage between the external side of the main positive switch module and the external side of the main negative switch module, which are collected twice.

In the embodiments of the present disclosure, when the main positive switch module, the main negative switch module and the respective detection loops in the detection circuit are all in the turned-off state, the main positive switch module or the main negative switch module is turned on, the voltage of the positive electrode of the battery pack, the voltage of the negative electrode of the battery pack, and the voltage between the external side of the main positive switch module and the external side of the main negative switch module are collected; then, any detection loop is turned on, the voltage of the positive electrode of the battery pack, the voltage of the negative electrode of the battery pack, and the voltage between the external side of the main positive switch module and the external side of the main negative switch module are re-collected, and thereafter, the resistance values of the insulation resistors of the external sides of the main positive switch module and the main negative switch module are obtained, according to the resistance values of the insulation resistors of the internal sides of the main positive switch module and the main negative switch module, as well as the voltage of the positive electrode of the battery pack, the voltage of the negative electrode of the battery pack, and the voltage between the external side of the main positive switch module and the external side of the main negative switch module, which are collected twice; that is, the resistance value of the insulation resistor of the external side of the main positive switch module to the reference potential terminal and the resistance value of the insulation resistor of the external side of the main negative switch module to the reference potential terminal can be detected, to obtain the insulation performance of the external sides of the main positive switch module and the main negative switch module, so as to avoid dangerous contact.

In addition, the detection circuit further includes: a pre-charge module. Herein, the pre-charge module is connected in parallel with the main positive switch module or the main negative switch module. The controller is specifically configured to turn on any one of the main positive switch module, the main negative switch module and the pre-charge module when the detection circuit is in the initial state, collect the voltages of the positive electrode and the negative electrode of the battery pack and the voltage between the external side of the main positive switch module and the external side of the main negative switch module, and re-collect the voltages of the positive electrode and the negative electrode of the battery pack and the voltage between the external side of the main positive switch module and the external side of the main negative switch module after any detection loop is turned on. In this embodiment, if the detection circuit includes the pre-charge module, the resistance values of the insulation resistors of the external sides of the main positive switch module and the main negative switch module can also be detected by turning on the pre-charge module.

In addition, the internal side of the main positive switch module and the internal side of the main negative switch module are respectively connected with the reference potential terminal through at least one detection loop. The controller is configured to turn on the main positive switch module or the main negative switch module when the detection circuit is in the initial state, collect the voltages of the positive electrode and the negative electrode of the battery pack and the voltage between the external side of the main positive switch module and the external side of the main negative switch module, and select an electrode with a larger voltage from the positive electrode and the negative electrode of the battery pack to be as a target electrode. The controller is configured to re-collect the voltages of the positive electrode and the negative electrode of the battery pack and the voltage between the external side of the main positive switch module and the external side of the main negative switch module after turning on a detection loop connected with the target electrode. In this embodiment, the detection loop connected with the electrode having a larger voltage is turned on, so that a voltage between the two electrodes of the battery pack can be reduced, which improves accuracy of voltage collection.

In addition, the internal side of the main positive switch module and/or the internal side of the main negative switch module are/is connected with the reference potential terminal through at least one detection loop. The controller is further configured to collect the voltages of the positive electrode and the negative electrode of the battery pack when the detection circuit is in the initial state, re-collect the voltages of the positive electrode and the negative electrode of the battery pack after turning on any detection loop, and obtain the resistance values of the insulation resistors of the internal sides of the main positive switch module and the main negative switch module according to the voltages of the positive electrode and the negative electrode of the battery pack, which are collected twice. In this embodiment, when the internal side of the main positive switch module and/or the internal side of the main negative switch module are/is connected with the reference potential terminal through the at least one detection loop, the resistance values of the insulation resistors of the internal sides of the main positive switch module and the main negative switch module can also be detected.

In addition, the controller is further configured to judge whether an insulation fault occurs, according to the resistance values of the insulation resistors of the internal sides of the main positive switch module and the main negative switch module; and the controller is configured to control the detection circuit being in the initial state when it is determined that no insulation fault occurs, turn on the main positive switch module or the main negative switch module, collect the voltages of the positive electrode and the negative electrode of the battery pack and the voltage between the external side of the main positive switch module and the external side of the main negative switch module, and re-collect the voltages of the positive electrode and the negative electrode of the battery pack and the voltage between the external side of the main positive switch module and the external side of the main negative switch module after turning on any detection loop. In this embodiment, it is determined that no insulation fault occurs according to the resistance values of the insulation resistors of the internal sides of the main positive switch module and the main negative switch module, and then the resistance values of the insulation resistors of the external sides of the main positive switch module and the main negative switch module are detected, which improves safety.

In addition, the internal side of the main positive switch module and the internal side of the main negative switch module are respectively connected with the reference potential terminal through at least one detection loop. The controller is configured to collect the voltages of the positive electrode and the negative electrode of the battery pack when the detection circuit is in the initial state, select an electrode with a larger voltage from the positive electrode and the negative electrode of the battery pack to be as the target electrode. The controller is configured to re-collect the voltages of the positive electrode and the negative electrode of the battery pack after turning on the detection loop connected with the target electrode, and obtain the resistance values of the insulation resistors of the internal sides of the main positive switch module and the main negative switch module according to the voltages of the positive electrode and the negative electrode of the battery pack, which are collected twice. In this embodiment, the detection loop connected with the electrode having a larger voltage is turned on, so that the voltage between the two electrodes of the battery pack can be reduced, which improves accuracy of voltage collection.

In addition, the detection loop includes a detection switch and a detection resistor. This embodiment provides a specific structure of the detection loop.

In addition, the pre-charge module includes a pre-charge contactor and a pre-charge resistor. This embodiment provides a specific structure of the pre-charge module.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements.

DETAILED DESCRIPTION

In order to make objective, technical solution and advantages of the embodiments of the present disclosure more apparent, hereinafter, the respective embodiments of the present disclosure will be described in detail with reference to the accompanying the drawings. However, those ordinarily skilled in the art may understand that, in the respective embodiments of the present disclosure, numerous technical details are set forth in order to provide a reader with a better understanding of the present application. However, the technical solutions claimed in the present application can be implemented without these technical details and with various changes and modifications based on the respective embodiments below.

In an electric vehicle, since a positive electrode and a negative electrode of the battery pack are respectively connected to an external load through a switch or a relay, and resistance values of the positive electrode and the negative electrode with respect to the ground shall be within a certain range, which indicates good insulation performance. A resistance value that is too low or too high means an insulation fault. However, when an insulation performance of an electric vehicle is detected, only a resistance value of an insulation resistor at an internal side of the relay can be detected, while a resistance value of an insulation resistor at an external side of the relay cannot be detected. A fault in the insulation resistor at the external side of the relay may result in dangerous contact between a high voltage of the power battery pack and the ground.

Hereinafter, the main positive switch module refers to a switch or a relay connected to the positive electrode of the battery pack, and the main negative switch module refers to a switch or a relay connected to the negative electrode of the battery pack. Turning on the main positive switch module or the main negative switch module indicates turning on the switch or closing the relay. The case of the main positive switch module or the main negative switch module is in turned-off state indicates that the switch is in a turned-off state or the relay is in a turned-off state.

Figure 1:
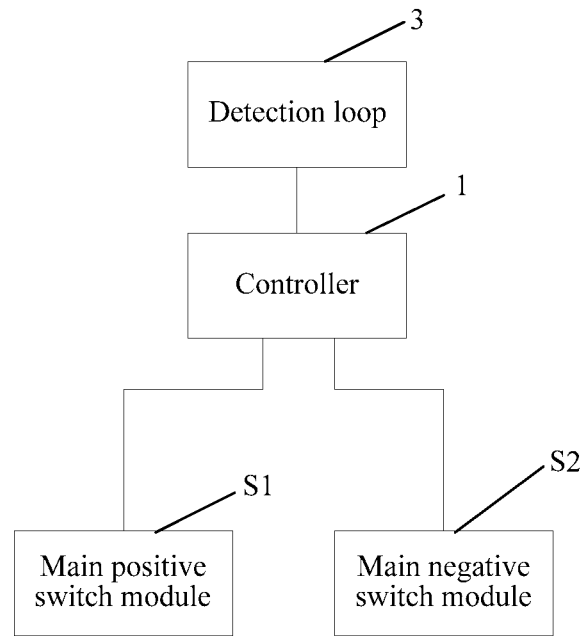
FIG. 1 is a block schematic diagram of a detection circuit according to an embodiment of the present disclosure.
Figure 2:
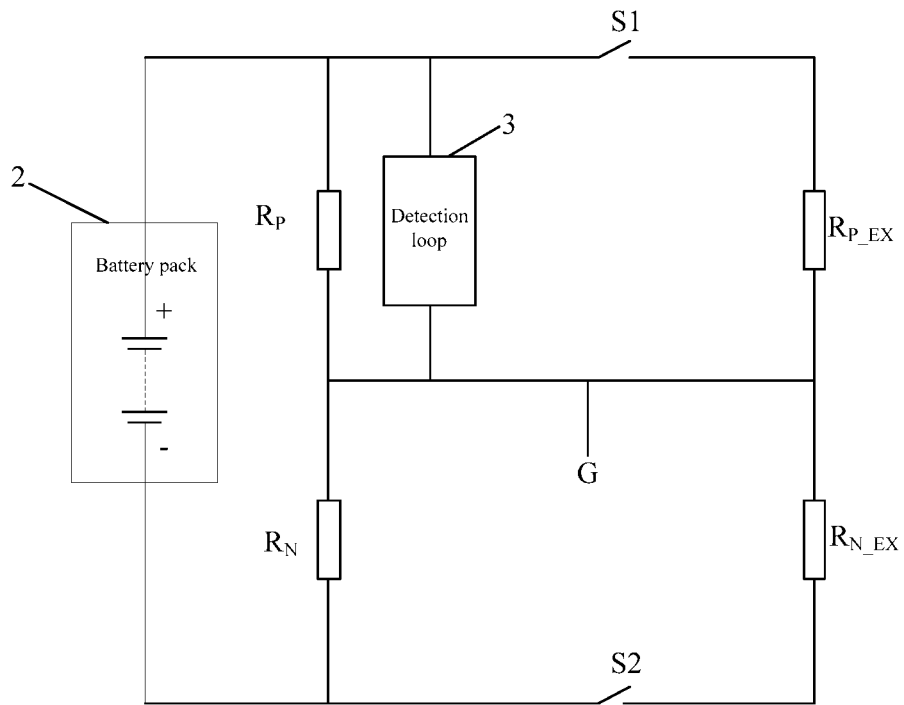
FIG. 2 to FIG. 4 are circuit structural diagrams of the detection circuit according to the embodiment of the present disclosure.
Figure 3:
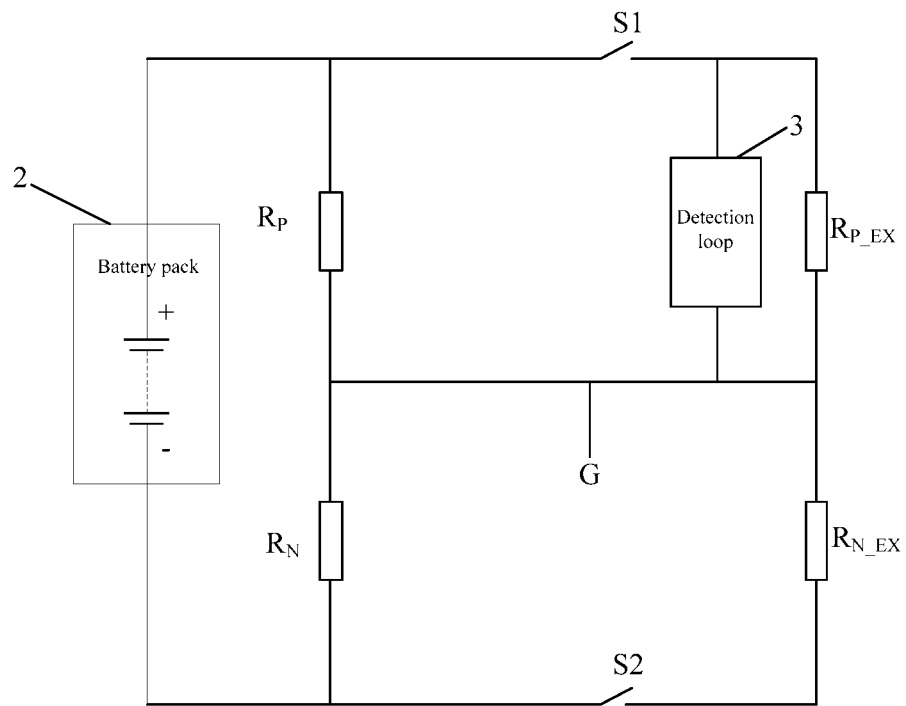

An embodiment of the present disclosure relates to a detection circuit, for detecting resistance values of insulation resistors of external side of a main positive switch module to external side of a main negative switch module, to determine insulation performance of the external sides of the main positive switch module and the main negative switch module. With reference to FIG. 1 to FIG. 3, the detection circuit comprises: a controller 1, a battery pack 2, a main positive switch module S1, a main negative switch module S2 and at least one detection loop 3.

Both sides of the main positive switch module S1 and both sides of the main negative switch module S2 are all connected with a reference potential terminal G, and one side of the main positive switch module S1 and/or one side of the main negative switch module S2 are/is connected with the reference potential terminal G through at least one detection loop 3. In FIG. 2, an internal side of the main positive switch module S1 is connected with the reference potential terminal G through a detection loop 3, and in FIG. 3, an external side of the main positive switch module S1 is connected with the reference potential terminal G through a detection loop 3. However, it is not limited thereto. An internal side and/or an external side of the main negative switch module S2 may also be connected with the reference potential terminal G through a detection loop 3. Herein, the reference potential terminal G may be a ground terminal. Further, a load resistor (not shown) is connected between the external side of the main positive switch module S1 and the external side of the main negative switch module S2.

In this embodiment, insulation resistors of the internal sides and the external sides of the main positive switch module S1 and the main negative switch module S2 are schematically illustrated in the diagram, which specifically include an insulation resistor $R_P$ of the internal side of the main positive switch module S1 to the reference potential terminal G, an insulation resistor $R_N$ of the internal side of the main negative switch module S2 to the reference potential terminal G, an insulation resistor $R_{P\_EX}$ of the external side of the main positive switch module S1 to the reference potential terminal G, and an insulation resistor $R_{N\_EX}$ of the external side of the main negative switch module S2 to the reference potential terminal G.

A positive electrode of the battery pack 2 is connected with the internal side of the main negative switch module S2, and a negative electrode of the battery pack 2 is connected with the internal side of the main negative switch module S2.

When the main positive switch module S1, the main negative switch module S2 and the respective detection loops are all in a turned-off state, the detection circuit is in an initial state, the controller 1 turns on the main positive switch module S1 or the main negative switch module S2, collects voltages of the positive electrode and the negative electrode of the battery pack 2 and a voltage between the external side of the main positive switch module S1 and the external side of the main negative switch module S2. And the controller 1 re-collects voltages of the positive electrode and the negative electrode of the battery pack 2 and a voltage between the external side of the main positive switch module S1 and the external side of the main negative switch module S2 after any detection loop 3 is turned on.

The controller is further configured to obtain the insulation resistors $R_{P\_EX}$ and $R_{N\_EX}$ of the external sides of the main positive switch module S1 and the main negative switch module S2, according to the insulation resistors $R_P$ and $R_N$ of the internal sides of the main positive switch module S1 and the main negative switch module S2, as well as the voltages of the positive electrode and the negative electrode of the battery pack 2 and the voltage between the external side of the main positive switch module S1 and the external side of the main negative switch module S2, which are collected twice.

Figure 4:
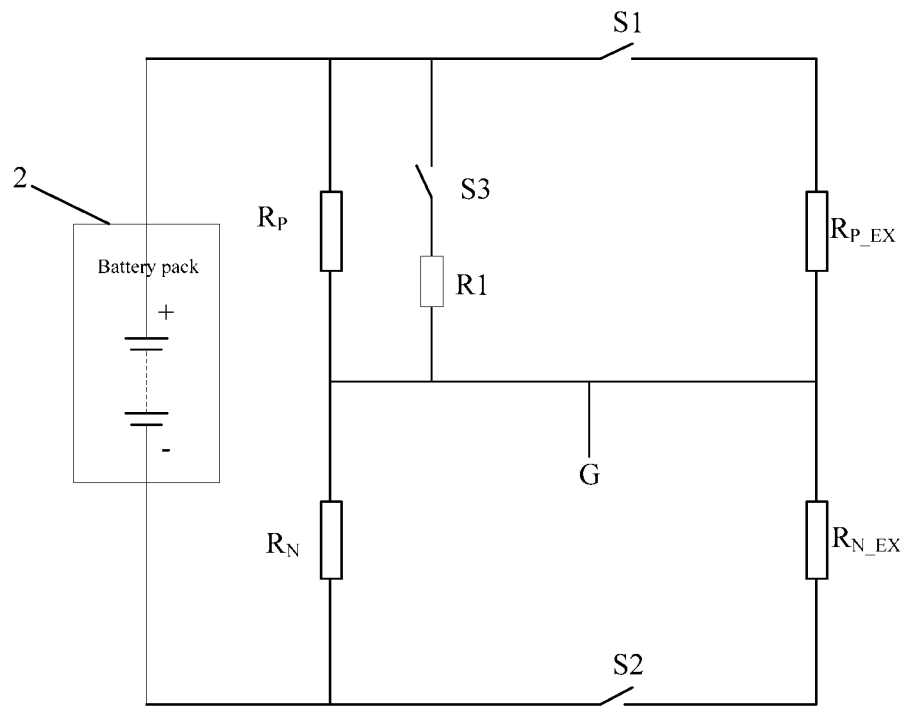

In this embodiment, the detection loop 3 includes a detection switch and a detection resistor. With a case where the internal side of the main positive switch module S1 is connected with the reference potential terminal G through a detection loop 3 as an example, the detection circuit shown in FIG. 4 is obtained, and the detection loop 3 includes a detection switch S3 and a detection resistor R1.

Hereinafter, with the detection circuit of FIG. 4 as an example, it is introduced how to detect resistance values of the insulation resistors $R_{P\_EX}$ and $R_{N\_EX}$ of the external sides of the main positive switch module S1 and the main negative switch module S2, specifically as follows.

When the main positive switch module S1, the main negative switch module S2 and the detection switch S3 are all in a turned-off state, the detection circuit is in the initial state, the controller 1 turns on the main positive switch module S1 or the main negative switch module S2, collect a voltage V1 of the positive electrode of the battery pack 2 to the reference potential terminal G, a voltage V2 of the negative electrode of the battery pack 2 to the reference potential terminal G, and a voltage V3 between the external side of the main positive switch module S1 and the external side of the main negative switch module S2. With a case where the main negative switch module S2 is turned on as an example, based on the collected voltages V1, V2 and V3, and Kirchhoff's current law, the following equation (1) may be obtained:

$$\frac{V1}{R_P} = \frac{|V2|}{R_N} + \frac{|V2|}{R_{N\_EX}} + \frac{|V2|-V3}{R_{P\_EX}} \quad (1)$$

The controller 1 turns on the detection switch S3, and re-collects a voltage V1' of the positive electrode of the battery pack 2 to the reference potential terminal G, a voltage V2' of the negative electrode of the battery pack 2 to the reference potential terminal G, and a voltage V3' between the external side of the main positive switch module S1 and the external side of the main negative switch module S2. With a case where the main negative switch module S2 is turned on as an example, based on the collected voltages V1', V2' and V3', and Kirchhoff's current law, the following equation (2) may be obtained:

$$\frac{V1'}{\frac{R_P \times R1}{R_P + R1}} = \frac{|V2'|}{R_N} + \frac{|V2'|}{R_{N\_EX}} + \frac{|V2'|-V3'}{R_{P\_EX}} \quad (2)$$

The controller 1 further combines Equation (1) and Equation (2) as described above to obtain a system of equations, into which resistance values of the insulation resistor $R_P$, the insulation resistor $R_N$ and the detection resistor R1, as well as the collected values of V1, V2, V3, V1', V2' and V3' are substituted, and determines resistance values of the insulation resistor $R_{P\_EX}$ and the insulation resistor $R_{N\_EX}$.

In this embodiment, when the main positive switch module, the main negative switch module and the respective detection loops in the detection circuit are all in the turned-off state, the main positive switch module or the main negative switch module is turned on, the voltage of the positive electrode of the battery pack, the voltage of the negative electrode of the battery pack, and the voltage between the external side of the main positive switch module and the external side of the main negative switch module are collected; then, any detection loop is turned on, the voltage of the positive electrode of the battery pack, the voltage of the negative electrode of the battery pack, and the voltage between the external side of the main positive switch module and the external side of the main negative switch module are re-collected, and thereafter, resistance values of the insulation resistors of the external sides of the main positive switch module and the main negative switch module are obtained, according to resistance values of the insulation resistors of the internal sides of the main positive switch module and the main negative switch module, as well as the voltage of the positive electrode of the battery pack, the voltage of the negative electrode of the battery pack, and the voltage between the external side of the main positive switch module and the external side of the main negative switch module, which are collected twice; that is, the resistance value of the insulation resistor of the external side of the main positive switch module to the reference potential terminal and the resistance value of the insulation resistor of the external side of the main negative switch module to the reference potential terminal can be detected, to obtain insulation performance of the external sides of the main positive switch module and the main negative switch module, so as to avoid dangerous contact.

Figure 5:
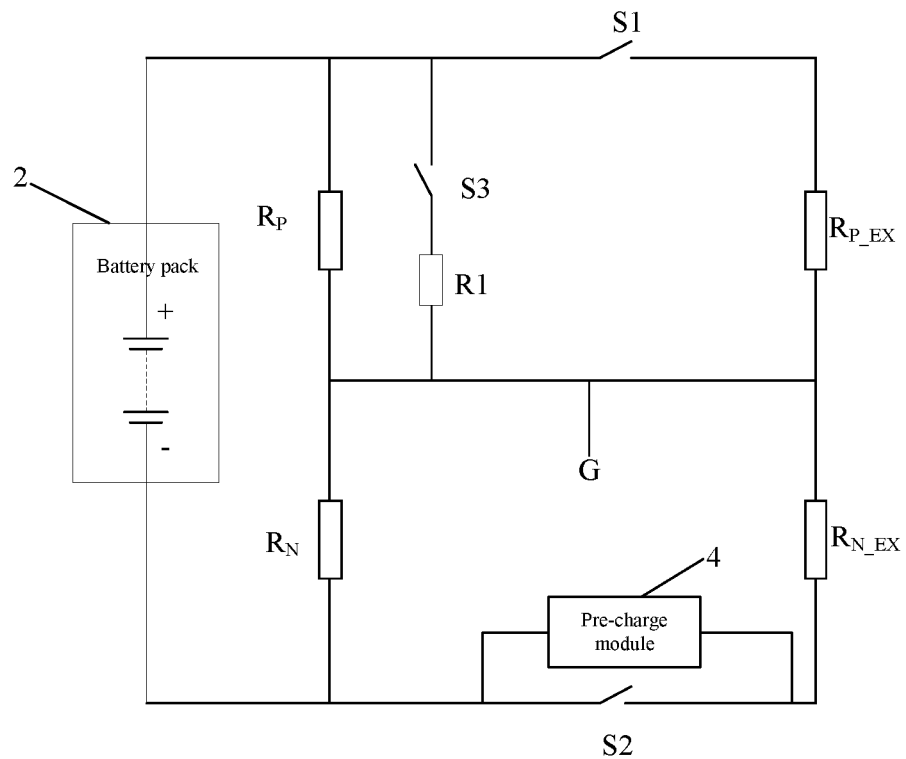
FIG. 5 and FIG. 6 are circuit structural diagrams of a detection circuit according to another embodiment of the present disclosure.

Another embodiment of the present disclosure relates to a detection circuit. With reference to FIG. 5, the detection circuit further comprises a pre-charge module 4, the pre-charge module 4 is connected in parallel with a main positive switch module S1 or a main negative switch module S2. In FIG. 5, a case where the pre-charge module 4 is connected in parallel with the main negative switch module S2 is taken as an example.

A controller 1 is specifically configured to turn on any one of the main positive switch module S1, the main negative switch module S2 and the pre-charge module 4 when the detection circuit is in an initial state, collect voltages of a positive electrode and a negative electrode of a battery pack 2 and a voltage between an external side of the main positive switch module S1 and an external side of the main negative switch module S2, and re-collect voltages of the positive electrode and the negative electrode of the battery pack 2 and a voltage between the external side of the main positive switch module S1 and the external side of the main negative switch module S2 after any detection loop 3 is turned on.

Figure 6:
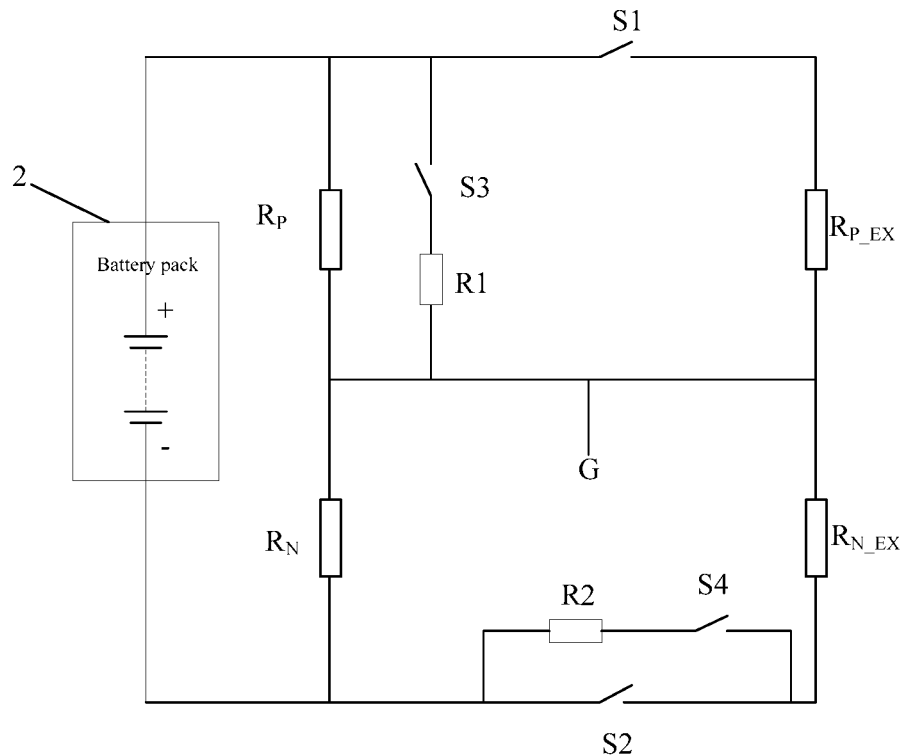

In this embodiment, with reference to FIG. 6, the pre-charge module 4 includes a pre-charge contactor S4 and a pre-charge resistor R2. Herein, a case where the pre-charge module 4 is connected in parallel with the main negative switch module S2 is taken as an example.

Hereinafter, with the detection circuit of FIG. 6 as an example, it is introduced how to detect resistance values of insulation resistors $R_{P\_EX}$ and $R_{N\_EX}$ of the external sides of the main positive switch module S1 and the main negative switch module S2, specifically as follows.

When the main positive switch module S1, the main negative switch module S2, the detection switch S3 and the pre-charge contactor S4 are all in a turned-off state, the detection circuit is in the initial state, and the controller 1 turns on any one of the main positive switch module S1, the main negative switch module S2 and the pre-charge contactor S4, and collects a voltage V1 of the positive electrode of the battery pack 2 to a reference potential terminal G, a voltage V2 of the negative electrode of the battery pack 2 to the reference potential terminal G, and a voltage V3 between the external side of the main positive switch module S1 and the external side of the main negative switch module S2. With a case where the pre-charge contactor S4 is turned on as an example, based on the collected voltages V1, V2 and V3, and Kirchhoff's current law, the following equation (1) may be obtained:

$$\frac{V1}{R_P} = \frac{|V2|}{R_N} + \frac{|V2|}{R_{N\_EX} + R2} + \frac{|V2| - V3}{R_{P\_EX}} \qquad (1)$$

The controller 1 turns on the detection switch S3, and re-collects a voltage V1' of the positive electrode of the battery pack 2 to the reference potential terminal G, a voltage V2' of the negative electrode of the battery pack 2 to the reference potential terminal G, and a voltage V3' between the external side of the main positive switch module S1 and the external side of the main negative switch module S2. With a case where the pre-charge contactor S4 is turned on as an example, based on the collected voltages V1', V2' and V3', and Kirchhoff's current law, the following equation (2) may be obtained:

$$\frac{V1'}{\frac{R_P \times R1}{R_P + R1}} = \frac{|V2'|}{R_N} + \frac{|V2'|}{R_{N\_EX} + R2} + \frac{|V2'| - V3'}{R_{P\_EX}} \qquad (2)$$

The controller 1 further combines Equation (1) and Equation (2) as described above to obtain a system of equations, into which resistance values of the insulation resistor $R_P$, the insulation resistor $R_N$, the detection resistor R1 and the pre-charge resistor R2, as well as the collected values of V1, V2, V3, V1', V2' and V3' are substituted, and determines the resistance values of the insulation resistor $R_{P\_EX}$ and the insulation resistor $R_{N\_EX}$.

It should be noted that, in this embodiment, it is mainly illustrated with a case where the pre-charge module 4 is connected in parallel with the main negative switch module S2 as an example; and a mode in which the pre-charge module 4 is connected in parallel with the main positive switch module S1 to detect the resistance values of the insulation resistor $R_{P\_EX}$ and the insulation resistor $R_{N\_EX}$ is similar to the above-described process, which will not be repeated here.

In this embodiment, if the detection circuit comprises the pre-charge module, the resistance values of the insulation resistors of the external sides of the main positive switch module and the main negative switch module can also be detected by turning on the pre-charge module.

Figure 7:
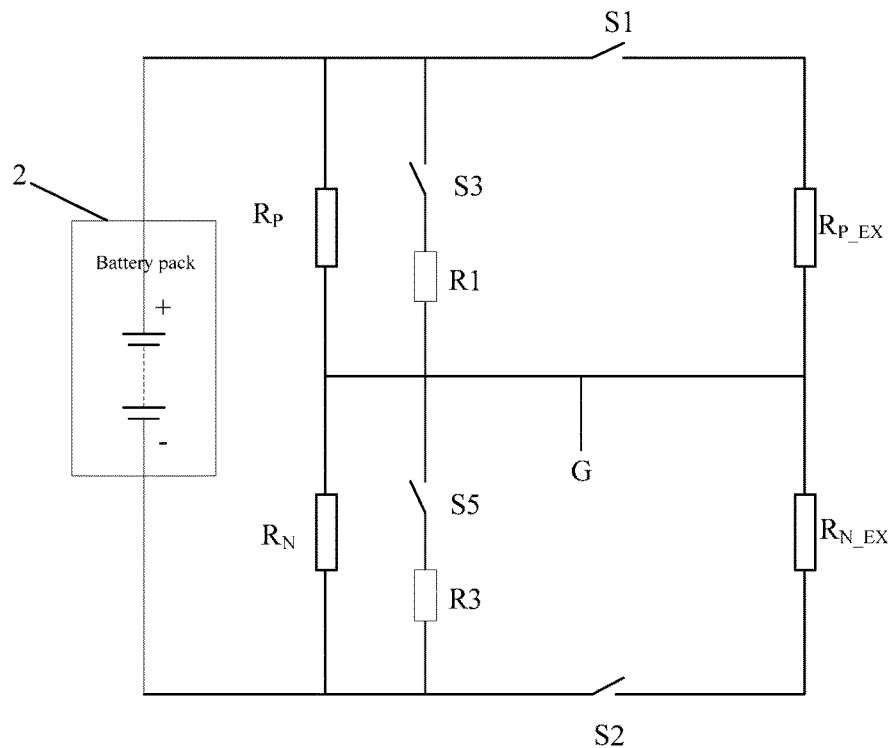
FIG. 7 to FIG. 9 are circuit structural diagrams of a detection circuit according to a further embodiment of the present disclosure.

Another embodiment of the present disclosure relates to a detection circuit. With reference to FIG. 7, an internal side of a main positive switch module S1 and an internal side of a main negative switch module S2 are both connected with a reference potential terminal G through at least one detection loop 3. Specifically, the internal side of the main positive switch module S1 is connected with the reference potential terminal G through a detection loop 3 including a detection switch S3 and a detection resistor R1, and the internal side of the main negative switch module S2 is connected with the reference potential terminal G through a detection loop 3 including a detection switch S5 and a detection resistor R3.

A controller 1 is configured to turn on the main positive switch module S1 or the main negative switch module S2 when the detection circuit is in an initial state, collect voltages of a positive electrode and a negative electrode of a battery pack 2 and a voltage between an external side of the main positive switch module S1 and an external side of the main negative switch module S2, select an electrode with a larger voltage from the positive electrode and the negative electrode of the battery pack 2 to be as a target electrode, and re-collect voltages of the positive electrode and the negative electrode of the battery pack 2 and a voltage between the external side of the main positive switch module S1 and the external side of the main negative switch module S2 after the detection loop 3 connected with the target electrode is turned on.

Hereinafter, with the detection circuit of FIG. 7 as an example, it is introduced how to detect resistance values of insulation resistors $R_{P\_EX}$ and $R_{N\_EX}$ of the external sides of the main positive switch module S1 and the main negative switch module S2, specifically as follows.

When the main positive switch module S1, the main negative switch module S2 and the detection switch S3 are all in a turned-off state, the detection circuit is in an initial state, the controller 1 turns on the main positive switch module S1 or the main negative switch module S2, collects a voltage V1 of the positive electrode of the battery pack 2 to the reference potential terminal G, a voltage V2 of the negative electrode of the battery pack 2 to the reference potential terminal G, and a voltage V3 between the external side of the main positive switch module S1 and the external side of the main negative switch module S2. With a case where the main negative switch module S2 is turned on as an example, based on the collected voltages V1, V2 and V3, and Kirchhoff's current law, the following equation (3) may be obtained:

$$\frac{V1}{R_P} = \frac{|V2|}{R_N} + \frac{|V2|}{R_{N\_EX}} + \frac{|V2| - V3}{R_{P\_EX}} \qquad (3)$$

The controller 1 judges a magnitude relationship between the voltage V1 of the positive electrode of the battery pack 2 to the reference potential terminal G and the voltage V2 of the positive electrode of the battery pack 2 to the reference potential terminal G, where, when V2 is a negative value, it is changed to an absolute value; and there may be two cases below.

(1) The controller 1 selects the positive electrode of the battery pack 2 as the target electrode when V1>|V2|, turns on the detection switch S3 of the detection loop 3 connected with the positive electrode of the battery pack 2, and re-collects a voltage V1' of the positive electrode of the battery pack 2 to the reference potential terminal G, a voltage V2' of the negative electrode of the battery pack 2 to the reference potential terminal G, and a voltage V3' between the external side of the main positive switch module S1 and the external side of the main negative switch module S2. With a case where the main negative switch module S2 is turned on as an example, based on the collected voltages V1', V2' and V3', and Kirchhoff's current law, the following equation (4) may be obtained:

$$\frac{V1'}{\frac{R_P \times R1}{R_P + R1}} = \frac{|V2'|}{R_N} + \frac{|V2'|}{R_{N\_EX}} + \frac{|V2'| - V3'}{R_{P\_EX}} \qquad (4)$$

The controller 1 further combines Equation (3) and Equation (4) as described above to obtain a system of equations, into which the resistance values of the insulation resistor $R_P$, the insulation resistor $R_N$ and the detection resistor R1, as well as the collected values of V1, V2, V3, V1', V2' and V3' are substituted, and determines the resistance values of the insulation resistor $R_{P\_EX}$ and the insulation resistor $R_{N\_EX}$.

(2) The controller 1 selects the negative electrode of the battery pack 2 as the target electrode when V1<|V2|, turns on the detection switch S5 of the detection loop 3 connected with the negative electrode of the battery pack 2, and re-collects a voltage V"of the positive electrode of the battery pack 2 to the reference potential terminal G, a voltage V2" of the negative electrode of the battery pack 2 to the reference potential terminal G, and a voltage V3" between the external side of the main positive switch module S1 and the external side of the main negative switch module S2. With a case where the main negative switch module S2 is turned on as an example, based on the collected voltages V1", V2" and V3", and Kirchhoff's current law, the following equation (5) may be obtained:

$$\frac{V1''}{R_P} = \frac{|V2''|}{R_N} + \frac{|V2''|}{R3} + \frac{|V2''|}{R_{N\_EX}} + \frac{|V2''| - V3''}{R_{P\_EX}} \quad (5)$$

The controller 1 further combines Equation (3) and Equation (5) as described above to obtain a system of equations, into which the resistance values of the insulation resistor $R_P$, the insulation resistor $R_N$ and the detection resistor R3, as well as the collected values of V1, V2, V3, V1", V2" and V3" are substituted, and determines the resistance values of the insulation resistor $R_{P\_EX}$ and the insulation resistor $R_{N\_EX}$.

Figure 8:
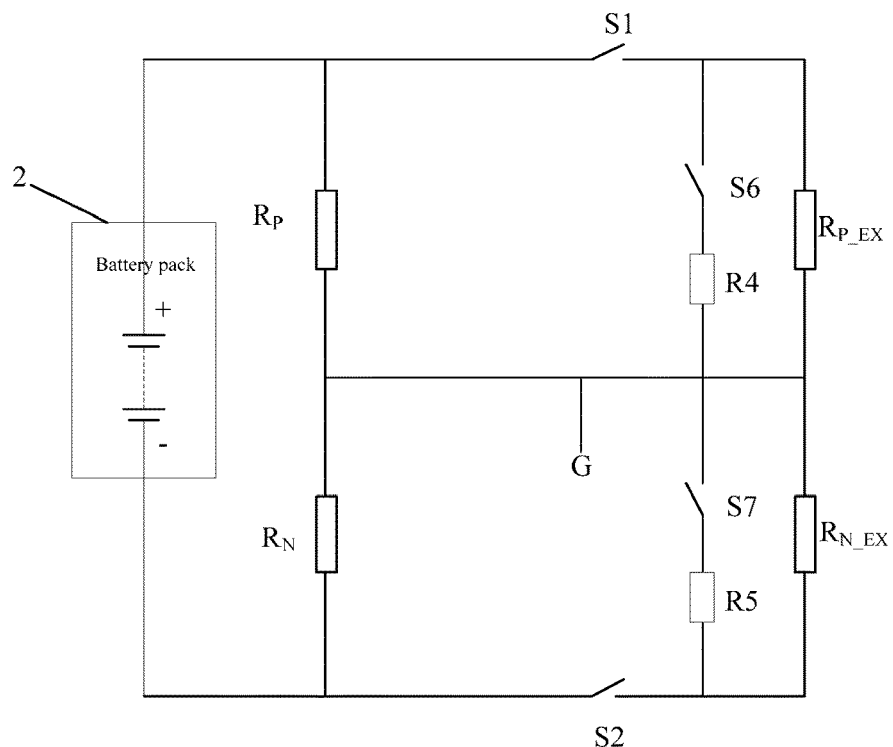

It should be noted that, in this embodiment, it may also be set that the external side of the main positive switch module S1 and the external side of the main negative switch module S2 are both connected with the reference potential terminal G through at least one detection loop 3, as shown in FIG. 8, so that the resistance values of the insulation resistor $R_{P\_EX}$ and the insulation resistor $R_{N\_EX}$ may also be detected, specifically in a mode similar to the above-described mode, which will not be repeated here.

Figure 9:
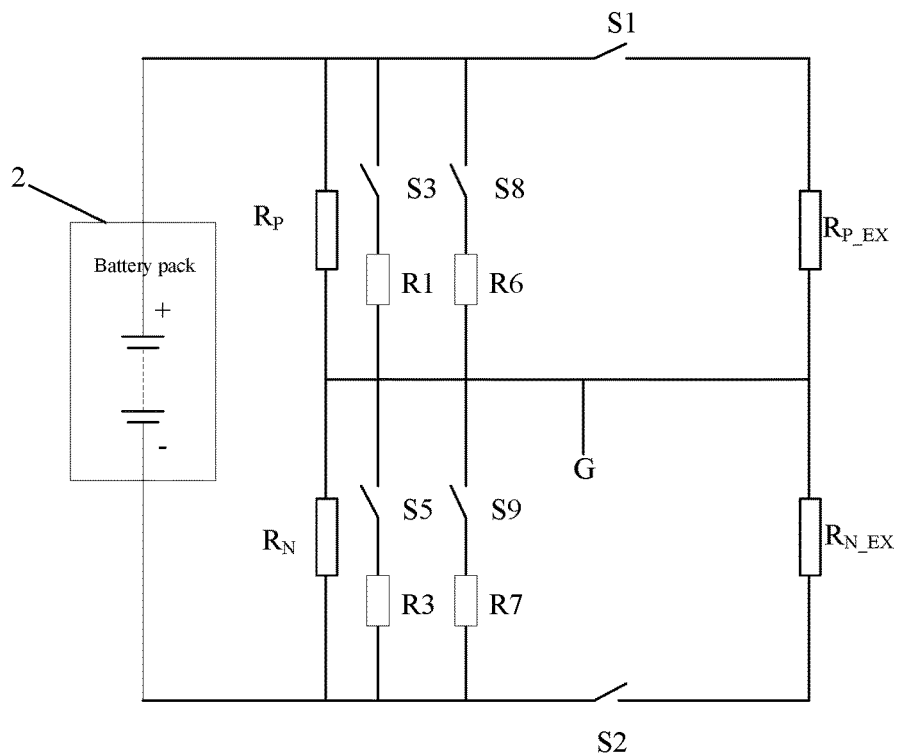

It should be further noted that, the internal side of the main positive switch module S1 and the internal side of the main negative switch module S2 are both connected with the reference potential terminal G through a plurality of detection loop 3, as shown in FIG. 9, and with a case where the internal side of the main positive switch module S1 and the internal side of the main negative switch module S2 are connected with the reference potential terminal G through two detection loops 3 connected in parallel as an example, the resistance values of the insulation resistor $R_{P\_EX}$ and the insulation resistor $R_{N\_EX}$ can also be detected.

In this embodiment, the detection loop connected with the electrode having a larger voltage is turned on, which, thus, can reduce the voltage at the electrode having a larger voltage, thereby reducing the voltage difference between the two electrodes of the battery pack, and improving accuracy of voltage collection. It should be noted that, this embodiment may further be taken as an improvement on the basis of each above-described embodiment, and may achieve a same technical effect.

An embodiment of the present disclosure relates to a detection circuit. In this embodiment, resistance values of insulation resistors of internal sides of a main positive switch module S1 and a main negative switch module S2 can be detected. Herein, the internal side of the main positive switch module S1 and/or the internal side of the main negative switch module S2 are/is connected with a reference potential terminal G through at least one detection loop 3. With the detection circuit shown in FIG. 4 as an example, the internal side of the main positive switch module S1 is connected with the reference potential terminal G through a detection loop 3, and the detection loop 3 includes a detection switch S3 and a detection resistor R1.

A controller 1 is further configured to collect voltages of a positive electrode and a negative electrode of a battery pack 2 when the detection loop 3 is in an initial state, re-collect voltages of the positive electrode and the negative electrode of the battery pack 2 after any detection loop 3 is turned on, and obtain resistance values of the insulation resistors of the internal sides of the main positive switch module S1 and the main negative switch module S2, according to the voltages of the positive electrode and the negative electrode of battery pack 2, which are collected twice.

Hereinafter, with the detection circuit of FIG. 4 as an example, it is introduced how to detect resistance values of insulation resistors $R_P$ and $R_N$ of the internal sides of the main positive switch module S1 and the main negative switch module S2, specifically as follows.

When the main positive switch module S1, the main negative switch module S2 and the detection switch S3 are all in a turned-off state, the detection circuit is in an initial state, and the controller 1 collects a voltage V1 of the positive electrode of the battery pack 2 to the reference potential terminal G1 and a voltage V2 of the negative electrode of the battery pack 2 to the reference potential terminal G, the following equation (6) may be obtained:

$$\frac{V1}{R_P} = \frac{|V2|}{R_N} \quad (6)$$

The controller 1 turns on the detection switch S3, and re-collects a voltage V1' of the positive electrode of the battery pack 2 to the reference potential terminal G and a voltage V2' of the negative electrode of the battery pack 2 to the reference potential terminal G, the following equation (7) may be obtained:

$$\frac{V1'}{\frac{R_P \times R1}{R_P + R1}} = \frac{|V2'|}{R_N} \quad (7)$$

The controller 1 further combines Equation (6) and Equation (7) as described above to obtain a system of equations, into which a resistance value of the detection resistor R1, as well as the collected values of V1, V2, V1' and V2' are substituted, and determines the resistance values of the insulation resistor $R_P$ and the insulation resistor $R_N$.

In this embodiment, it may also be set that the internal side of the main positive switch module S1 and the internal side of the main negative switch module S2 are both connected with the reference potential terminal G through at least one detection loop 3, as shown in FIG. 7, the internal side of the main positive switch module S1 is connected with the reference potential terminal G through a detection loop 3 including a detection switch S3 and a detection resistor R1, and the internal side of the main negative switch module S2 is connected with the reference potential terminal G through a detection loop 3 including a detection switch S5 and a detection resistor R3.

Hereinafter, with the detection circuit of FIG. 7 as an example, it is introduced how to detect the resistance values of the insulation resistors $R_P$ and $R_N$ of the internal sides of the main positive switch module S1 and the main negative switch module S2, specifically as follows.

When the main positive switch module S1, the main negative switch module S2 and the detection switch S3 are all in a turned-off state, the detection circuit is in the initial state, and the controller 1 collects a voltage V1 of the positive electrode of the battery pack 2 to the reference potential terminal G1 and a voltage V2 of the negative electrode of the battery pack 2 to the reference potential terminal G, the following equation (6) may be obtained:

$$\frac{V1}{R_P} = \frac{|V2|}{R_N} \quad (6)$$

The controller 1 further judges a magnitude relationship between the voltage V1 of the positive electrode of the battery pack 2 to the reference potential terminal G and the voltage V2 of the negative electrode of the battery pack 2 to the reference potential terminal G, where, when V2 is a negative value, it is changed to an absolute value; and there may be two cases below.

(1) The controller 1 selects the positive electrode of the battery pack 2 as the target electrode when V1>|V2|, turns on the detection switch S3 of the detection loop 3 connected with the positive electrode of the battery pack 2, and re-collects a voltage V1' of the positive electrode of the battery pack 2 to the reference potential terminal G and a voltage V2' of the negative electrode of the battery pack 2 to the reference potential terminal G. The following equation (7) may be obtained:

$$\frac{V1'}{\frac{R_P \times R1}{R_P + R1}} = \frac{|V2'|}{R_N} \quad (7)$$

The controller 1 further combines Equation (6) and Equation (7) as described above to obtain a system of equations, into which the resistance value of the detection resistor R1, as well as the collected values of V1, V2, V1' and V2' are substituted, and determines the resistance values of the insulation resistor $R_P$ and the insulation resistor $R_N$.

(2) The controller 1 selects the negative electrode of the battery pack 2 as the target electrode when V1<|V2|, turns on the detection switch S5 of the detection loop 3 connected with the negative electrode of the battery pack 2, and re-collects a voltage V1" of the positive electrode of the battery pack 2 to the reference potential terminal G and a voltage V2" of the negative electrode of the battery pack 2 to the reference potential terminal G. The following equation (8) may be obtained:

$$\frac{V1''}{R_P} = \frac{|V2''|}{\frac{R_N \times R3}{R_N + R3}} \quad (8)$$

The controller 1 further combines Equation (6) and Equation (8) as described above to obtain a system of equations, into which the resistance value of the detection resistor R3, as well as the collected values of V1, V2, V1" and V2", and determines the resistance values of the insulation resistor $R_P$ and the insulation resistor $R_N$.

In an example, after detecting the resistance values of the insulation resistor $R_P$ and the insulation resistor $R_N$, the controller 1 judges whether an insulation fault occurs, according to the detected resistance values of the insulation resistor $R_P$ and the insulation resistor $R_N$. For example, the insulation fault may be a short circuit fault due to an excessively low resistance value, a non-safety fault due to an excessively high resistance value, or the like. The controller 1 determines that no insulation fault occurs when the resistance values of the insulation resistor $R_P$ and the insulation resistor $R_N$ are both within a preset range, and then detects the resistance values of the insulation resistors $R_{P\_EX}$ and $R_{N\_EX}$ of the external sides of the main positive switch module S1 and the main negative switch module S2, which improves safety. And a mode for detecting the resistance values of the insulation resistors insulation resistors $R_{P\_EX}$ and $R_{N\_EX}$ will not be repeated here.

In this embodiment, when the internal side of the main positive switch module and/or the internal side of the main negative switch module are/is connected with the reference potential terminal through at least one detection circuit, resistance values of the insulation resistors of the internal sides of the main positive switch module and the main negative switch module may be further detected. It should be noted that, this embodiment may further be taken as an improvement on the basis of any above-described embodiment, and may achieve a same technical effect.

An embodiment of the present disclosure relates to a detection method, applied to the detection circuit according to the above-described embodiment, with reference to FIG. 1 to FIG. 4. Hereinafter, it will be illustrated with the detection circuit of FIG. 4 as an example.

Figure 10:
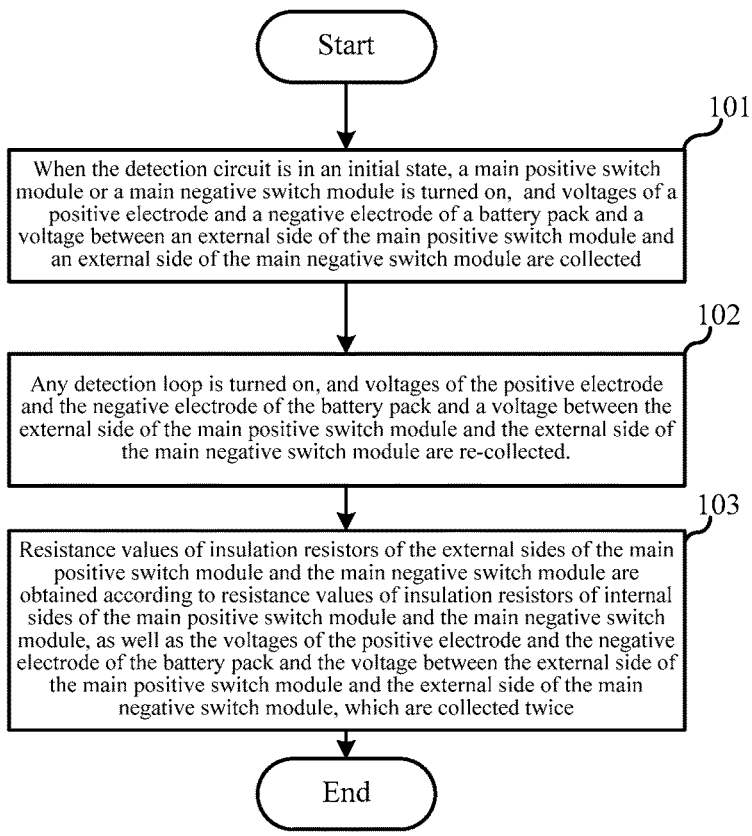
FIG. 10 is a specific flow chart of a detection method according to an embodiment of the present disclosure.

A specific flow of the detection method according to this embodiment is as shown in FIG. 10.

Step 101, a main positive switch module or a main negative switch module is turned on when the detection circuit is in an initial state, and voltages of a positive electrode and a negative electrode of a battery pack and a voltage between an external side of the main positive switch module and an external side of the main negative switch module are collected.

Specifically, when a main positive switch module S1, a main negative switch module S2 and a detection switch S3 are all in a turned-off state, the detection circuit is in the initial state, a controller 1 turns on the main positive switch module S1 or the main negative switch module S2, collects a voltage V1 of the positive electrode of the battery pack 2 to a reference potential terminal G, a voltage V2 of the negative electrode of the battery pack 2 to the reference potential terminal G, and a voltage V3 between the external side of the main positive switch module S1 and the external side of the main negative switch module S2. With a case where the main negative switch module S2 is turned on as an example, based on the collected voltages V1, V2 and V3, and Kirchhoff's current law, the following equation (1) may be obtained:

$$\frac{V1}{R_P} = \frac{|V2|}{R_N} + \frac{|V2|}{R_{N\_EX}} + \frac{|V2| - V3}{R_{P\_EX}} \quad (1)$$

Step 102, any detection loop is turned on, and voltages of the positive electrode and the negative electrode of the battery pack and a voltage between the external side of the main positive switch module and the external side of the main negative switch module are re-collected.

Specifically, the controller 1 turns on the detection switch S3, and re-collects a voltage V1' of the positive electrode of the battery pack 2 to the reference potential terminal G, a voltage V2' of the negative electrode of the battery pack 2 to the reference potential terminal G, and a voltage V3' between the external sides of the main positive switch module S1 and the main negative switch module S2. With a case where the main negative switch module S2 is turned on as an example, based on the collected voltages V1', V2' and V3', and Kirchhoff's current law, the following equation (2) may be obtained:

$$\frac{V1'}{\frac{R_P \times R1}{R_P + R1}} = \frac{|V2'|}{R_N} + \frac{|V2'|}{R_{N\_EX}} + \frac{|V2'| - V3'}{R_{P\_EX}} \quad (2)$$

Step 103, resistance values of insulation resistors of the external sides of the main positive switch module and the main negative switch module are obtained according to resistance values of insulation resistors of internal sides of the main positive switch module and the main negative switch module, as well as the voltages of the positive electrode and the negative electrode of the battery pack and the voltage between the external side of the main positive switch module and the external side of the main negative switch module, which are collected twice.

Specifically, the controller 1 further combines Equation (1) and Equation (2) as described above to obtain a system of equations, into which resistance values of an insulation resistor $R_P$, an insulation resistor $R_N$ and a detection resistor R1, as well as the collected values of V1, V2, V3, V1', V2' and V3' are substituted, and determines resistance values of an insulation resistor $R_{P\_EX}$ and an insulation resistor $R_{N\_EX}$.

Since the above-described embodiment of the detection circuit mutually corresponds to this embodiment, this embodiment may be implemented in mutual cooperation with the above-described embodiment. The related technical details as mentioned in the above-described embodiment are still available in this embodiment, and the technical effects that can be achieved in the above-described embodiment can also be achieved in this embodiment, which will not be described here, in order to reduce repetition. Accordingly, the related technical details as mentioned in this embodiment may also be applied to the above-described embodiment.

In this embodiment, when the main positive switch module, the main negative switch module and the respective detection loops in the detection circuit are all in the turned-off state, the main positive switch module or the main negative switch module is turned on, the voltage of the positive electrode of the battery pack, the voltage of the negative electrode of the battery pack, and the voltage between the external side of the main positive switch module and the external side of the main negative switch module are collected; then, any detection loop is turned on, the voltage of the positive electrode of the battery pack, the voltage of the negative electrode of the battery pack, and the voltage between the external side of the main positive switch module and the external side of the main negative switch module are re-collected, and thereafter, resistance values of the insulation resistors of the external sides of the main positive switch module and the main negative switch module are obtained, according to resistance values of the insulation resistors of the internal sides of the main positive switch module and the main negative switch module, as well as the voltage of the positive electrode of the battery pack, the voltage of the negative electrode of the battery pack, and the voltage between the external side of the main positive switch module and the external side of the main negative switch module, which are collected twice; that is, the resistance value of the insulation resistor of the external side of the main positive switch module to the reference potential terminal and the resistance value of the insulation resistor of the external side of the main negative switch module to the reference potential terminal can be detected, to obtain insulation performances of the external sides of the main positive switch module and the main negative switch module, so as to avoid dangerous contact.

Another embodiment of the present disclosure relates to a detection method. In this embodiment, resistance values of insulation resistors $R_{P\_EX}$ and $R_{N\_EX}$ are detected by turning on a pre-charge module. In this embodiment, it will be illustrated with the detection circuit of FIG. 6 as an example.

Figure 11:
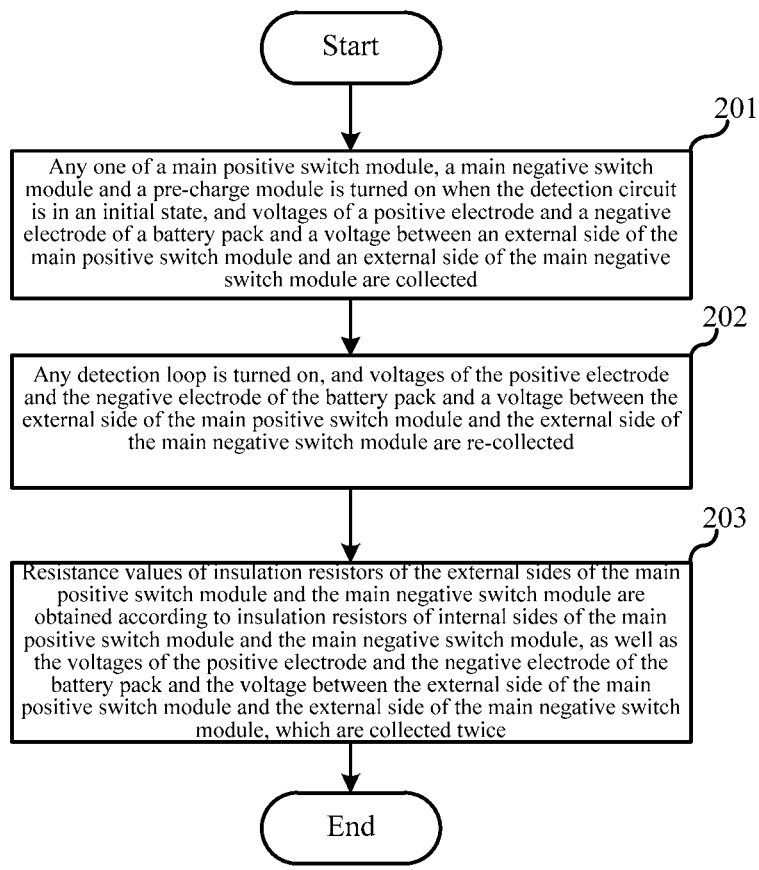
FIG. 11 is a specific flow chart of a detection method according to another embodiment of the present disclosure.

A specific flow of the detection method according to this embodiment is shown in FIG. 11.

Step 201, any one of a main positive switch module, a main negative switch module and the pre-charge module is turned on when the detection circuit is in an initial state, and voltages of a positive electrode and a negative electrode of a battery pack and a voltage between an external side of the main positive switch module and an external side of the main negative switch module are collected.

Specifically, when a main positive switch module S1, a main negative switch module S2, a detection switch S3 and a pre-charge contactor S4 are all in a turned-off state, the detection circuit is in an initial state, a controller 1 turns on any one of the main positive switch module S1, the main negative switch module S2 and the pre-charge contactor S4, collects a voltage V1 of the positive electrode of the battery pack 2 to a reference potential terminal G, a voltage V2 of the negative electrode of the battery pack 2 to the reference potential terminal G, and a voltage V3 between an external side of the main positive switch module S1 and an external side of the main negative switch module S2. With a case where the pre-charge contactor S4 is turned on as an example, based on the collected voltages V1, V2 and V3, and Kirchhoff's current law, the following equation (1) may be obtained:

$$\frac{V1}{R_P} = \frac{|V2|}{R_N} + \frac{|V2|}{R_{N\_EX} + R2} + \frac{|V2| - V3}{R_{P\_EX}} \quad (1)$$

Step 202, any detection loop is turned on, and voltages of the positive electrode and the negative electrode of the battery pack and a voltage between the external side of the main positive switch module and the external side of the main negative switch module are re-collected.

Specifically, the controller 1 turns on the detection switch S3, and re-collects a voltage V1' of the positive electrode of the battery pack 2 to the reference potential terminal G, a voltage V2' of the negative electrode of the battery pack 2 to the reference potential terminal G, and a voltage V3' between the external side of the main positive switch module S1 and the external side of the main negative switch module S2. With a case where the pre-charge contactor S4 is turned on as an example, based on the collected voltages V1', V2' and V3', and Kirchhoff's current law, the following equation (2) may be obtained:

$$\frac{V1'}{\frac{R_P \times R1}{R_P + R1}} = \frac{|V2'|}{R_N} + \frac{|V2'|}{R_{N\_EX} + R2} + \frac{|V2'| - V3'}{R_{P\_EX}} \quad (2)$$

Step 203, resistance values of insulation resistors of the external sides of the main positive switch module and the main negative switch module, according to the resistance values of insulation resistors of internal sides of the main positive switch module and the main negative switch module, as well as the voltages of the positive electrode and the negative electrode of the battery pack and the voltage between the external side of the main positive switch module and the external side of the main negative switch module, which are collected twice.

Specifically, the controller 1 further combines Equation (1) and Equation (2) as described above to obtain a system of equations, into which resistance values of an insulation resistor $R_P$, an insulation resistor $R_N$, a detection resistor R1 and a pre-charge resistor R2, as well as the collected values of V1, V2, V3, V1', V2' and V3' are substituted, and determines resistance values of an insulation resistor $R_{P\_EX}$ and an insulation resistor $R_{N\_EX}$.

Since the above-described embodiment of the detection circuit mutually corresponds to this embodiment, this embodiment may be implemented in mutual cooperation with the above-described embodiment. The related technical details as mentioned in the above-described embodiment are still available in this embodiment, and the technical effects that can be achieved in the above-described embodiment can also be implemented in this embodiment, which will not be described here, in order to reduce repetition. Accordingly, the related technical details as mentioned in this embodiment may also be applied to the above-described embodiment.

In this embodiment, if the detection circuit includes the pre-charge module, resistance values of the insulation resistors of the external sides of the main positive switch module and the main negative switch module can also be detected by turning on the pre-charge module.

Another embodiment of the present disclosure relates to a detection method. This embodiment improves accuracy of voltage collection. In this embodiment, it will be illustrated with the detection circuit of FIG. 7 as an example.

Figure 12:
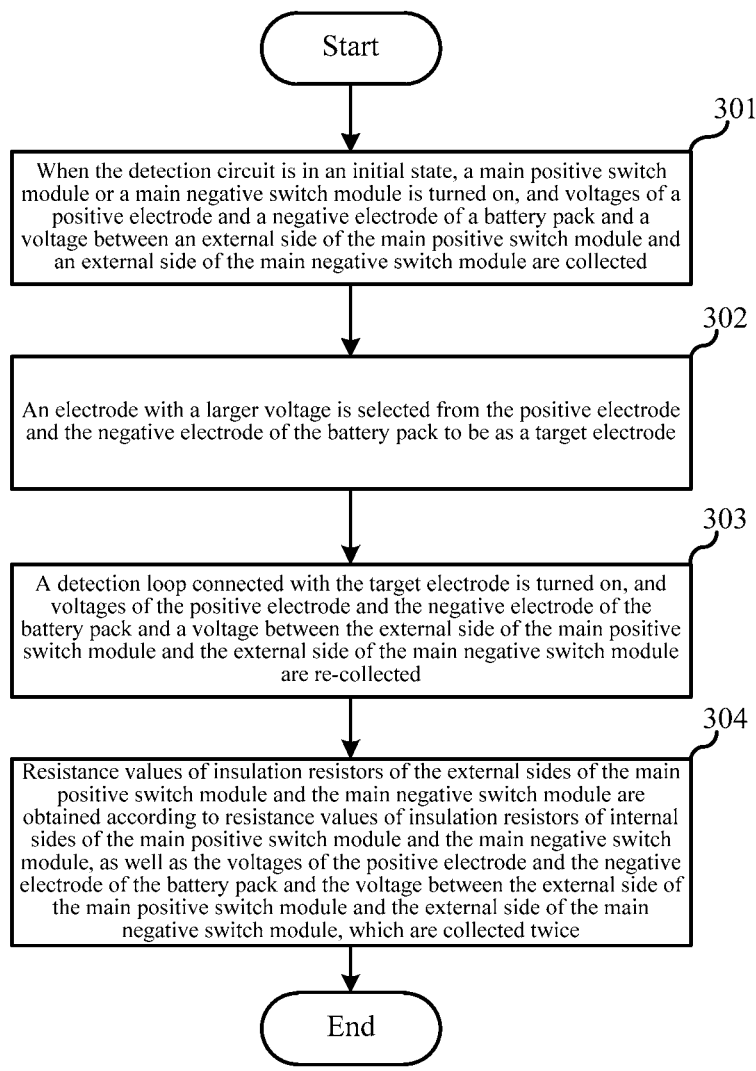
FIG. 12 is a specific flow chart of a detection method according to a further embodiment of the present disclosure.

A specific flow of the detection method according to this embodiment is shown in FIG. 12.

Step 301, a main positive switch module or a main negative switch module is turned on when the detection circuit is in an initial state, and voltages of a positive electrode and a negative electrode of a battery pack and a voltage between an external side of the main positive switch module and an external side of the main negative switch module are collected.

Specifically, when a main positive switch module S1, a main negative switch module S2 and a detection switch S3 are all in a turned-off state, the detection circuit is in the initial state, a controller 1 turns on the main positive switch module S1 or the main negative switch module S2, collects a voltage V1 of a positive electrode of a battery pack 2 to a reference potential terminal G, a voltage V2 of a negative electrode of the battery pack 2 to the reference potential terminal G, and a voltage V3 between an external side of the main positive switch module S1 and an external side of the main negative switch module S2. With a case where the main negative switch module S2 is turned on as an example, based on the collected voltages V1, V2 and V3, and Kirchhoff's current law, the following equation (3) may be obtained:

$$\frac{V1}{R_P} = \frac{|V2|}{R_N} + \frac{|V2|}{R_{N\_EX}} + \frac{|V2| - V3}{R_{P\_EX}} \quad (3)$$

Step 302, an electrode with a larger voltage in the positive electrode and the negative electrode of the battery pack is selected to be as a target electrode.

Step 303, a detection loop connected with the target electrode is turned on, and voltages of the positive electrode and the negative electrode of the battery pack, and a voltage between the external side of the main positive switch module and the external side of the main negative switch module are re-collected.

Step 304, resistance values of insulation resistors of the external sides of the main positive switch module and the main negative switch module are obtained according to resistance values of insulation resistors of internal sides of the main positive switch module and the main negative switch module, as well as the voltages of the positive electrode and the negative electrode of the battery pack and the voltage between the external side of the main positive switch module and the external side of the main negative switch module, which are collected twice.

Specifically, the controller 1 judges a magnitude relationship between the voltage V1 of the positive electrode of the battery pack 2 to the reference potential terminal G and the voltage V2 of the negative electrode of the battery pack 2 to the reference potential terminal G, where, when V2 is a negative value, it is changed to an absolute value; and there may be two cases below.

(1) The controller 1 selects the positive electrode of the battery pack 2 as the target electrode when V1>|V2|, turns on the detection switch S3 of the detection loop 3 connected with the positive electrode of the battery pack 2, and re-collects a voltage V1' of the positive electrode of the battery pack 2 to the reference potential terminal G, a voltage V2' of the negative electrode of the battery pack 2 to the reference potential terminal G, and a voltage V3' between the external side of the main positive switch module S1 and the external side of the main negative switch module S2. With a case where the main negative switch module S2 is turned on as an example, based on the collected voltages V1', V2' and V3', and Kirchhoff's current law, the following equation (4) may be obtained:

$$\frac{V1'}{\frac{R_P \times R1}{R_P + R1}} = \frac{|V2'|}{R_N} + \frac{|V2'|}{R_{N\_EX}} + \frac{|V2'| - V3'}{R_{P\_EX}} \quad (4)$$

The controller 1 further combines Equation (3) and Equation (4) as described above to obtain a system of equations, into which i the resistance values of an insulation resistor $R_P$, an insulation resistor $R_N$ and a detection resistor R1, as well as the collected values of V1, V2, V3, V1', V2' and V3' are substituted, and determines resistance values of an insulation resistor $R_{P\_EX}$ and an insulation resistor $R_{N\_EX}$.

(2) The controller 1 selects the negative electrode of the battery pack 2 as the target electrode when V1<|V2|, turns on a detection switch S5 of the detection loop 3 connected with the negative electrode of the battery pack 2, and re-collects a voltage V1" of the positive electrode of the battery pack 2 to the reference potential terminal G, a voltage V2" of the negative electrode of the battery pack 2 to the reference potential terminal G, and a voltage V3" between the external side of the main positive switch module S1 and the external side of the main negative switch module S2. With a case where the main negative switch module S2 is turned on as an example, based on the collected voltages V1", V2" and V3", and Kirchhoff's current law, the following equation (5) may be obtained:

$$\frac{V1''}{R_P} = \frac{|V2''|}{R_N} + \frac{|V2''|}{R3} + \frac{|V2''|}{R_{N\_EX}} + \frac{|V2''| - V3''}{R_{P\_EX}} \quad (5)$$

The controller 1 further combines Equation (3) and Equation (5) as described above to obtain a system of equations, into which the resistance values of the insulation resistor $R_P$, the insulation resistor $R_N$ and a detection resistor R3, as well as the collected values of V1, V2, V3, V1", V2" and V3" are substituted, and determines the resistance values of the insulation resistor $R_{P\_EX}$ and the insulation resistor $R_{N\_EX}$.

It should be noted that, in this embodiment, it may also be set that the external side of the main positive switch module S1 and the external side of the main negative switch module S2 are both connected with the reference potential terminal G through at least one detection loop 3, as shown in FIG. 8, which may also have the resistance values of the insulation resistor $R_{P\_EX}$ and the insulation resistor $R_{N\_EX}$ detected, specifically in a mode similar to the above-described mode, which will not be repeated here.

It should be further noted that, the internal side of the main positive switch module S1 and the internal side of the main negative switch module S2 are both connected with the reference potential terminal G through a plurality of detection loop 3, as shown in FIG. 9, and with a case where the internal side of the main positive switch module S1 and the internal side of the main negative switch module S2 are connected with the reference potential terminal G through two detection loop 3 connected in parallel as an example, the insulation resistors of the insulation resistor $R_{P\_EX}$ and the insulation resistor $R_{N\_EX}$ can also be detected.

Since the above-described embodiment of the detection circuit mutually corresponds to this embodiment, this embodiment may be implemented in mutual cooperation with the above-described embodiment. The related technical details as mentioned in the above-described embodiment are still available in this embodiment, and the technical effects that can be achieved in the above-described embodiment can also be achieved in this embodiment, which will not be described here, in order to reduce repetition. Accordingly, the related technical details as mentioned in this embodiment may also be applied to the above-described embodiment.

In this embodiment, the detection loop connected with the electrode having a larger voltage is turned on, which, thus, can reduce the voltage between the two electrodes of the battery pack, and improve accuracy of voltage collection. It should be noted that, this embodiment may further be taken as an improvement on the basis of each above-described embodiment, and may achieve a same technical effect.

Another embodiment of the present disclosure relates to a detection method. In this embodiment, resistance values of insulation resistors of internal sides of the main positive switch module S1 and the main negative switch module S2 can be detected. And this embodiment is illustrated with the detection circuit of FIG. 7 as an example.

Figure 13:
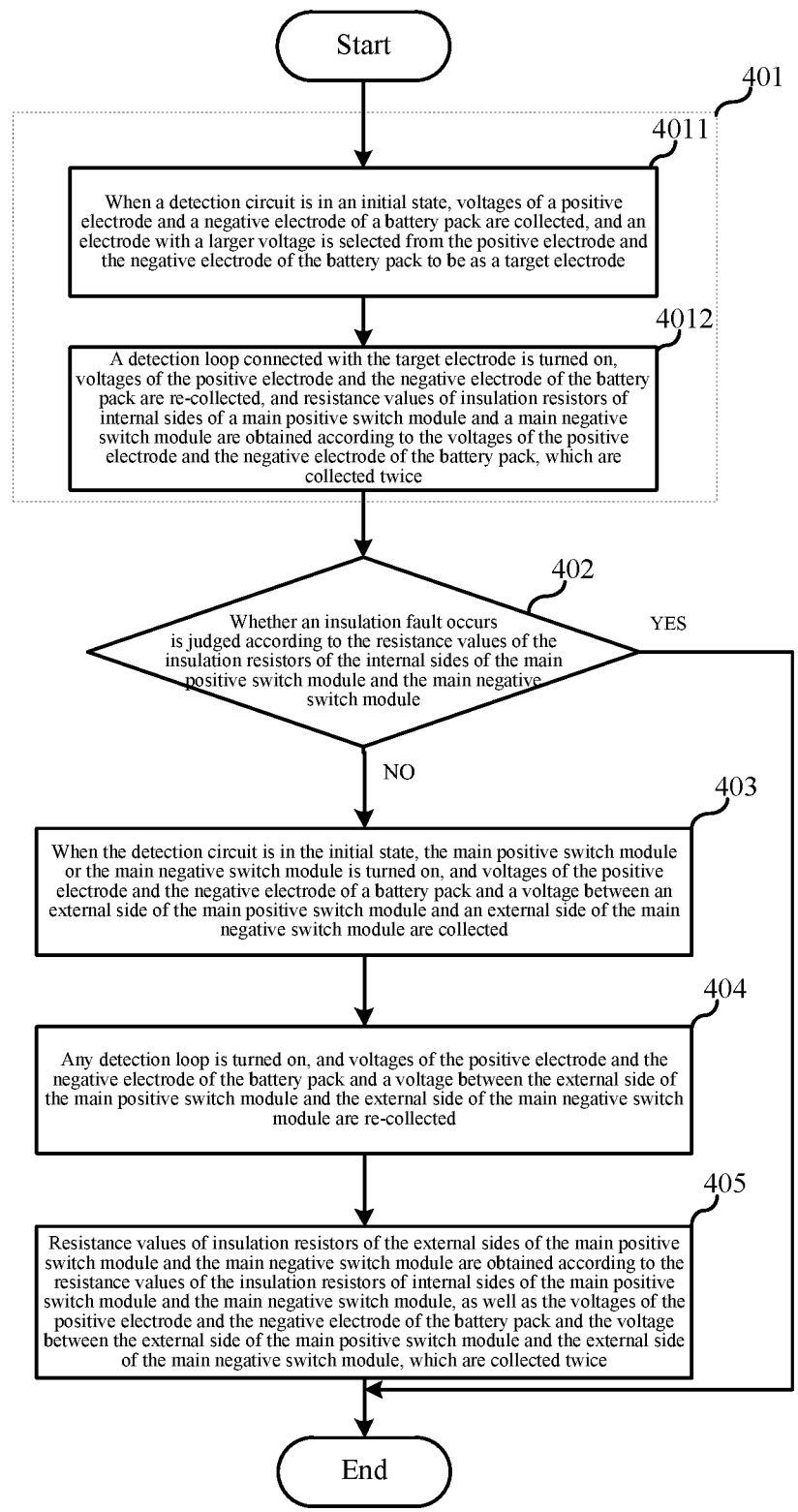
FIG. 13 is a specific flow chart of a detection method according to a further embodiment of the present disclosure.

A specific flow of the detection method according to this embodiment is shown in FIG. 13.

Herein, step 403 to step 405 are substantially the same as step 101 to step 103, which will not be repeated here.

Step 401, the step of collecting voltages of a positive electrode and a negative electrode of the battery pack when the detection circuit is in an initial state, re-collecting voltages of the positive electrode and the negative electrode of the battery pack after any detection loop is turned on, and obtaining resistance values of insulation resistors of the internal sides of the main positive switch module and the main negative switch module according to the voltages of the positive electrode and the negative electrode of the battery pack collected twice, includes the following sub-steps.

Sub-step 4011: the voltages of the positive electrode and the negative electrode of the battery pack are collected when the detection circuit is in the initial state, and an electrode with a larger voltage in the positive electrode and the negative electrode of the battery pack is selected to be as a target electrode.

Sub-step 4012: a detection loop connected with the target electrode is turned on, the voltages of the positive electrode and the negative electrode of the battery pack are re-collected, and resistance values of the insulation resistors of the internal sides of the main positive switch module and the main negative switch module are obtained according to the voltages of the positive electrode and the negative electrode of the battery pack, which are collected twice.

Specifically, when a main positive switch module S1, a main negative switch module S2 and a detection switch S3 are all in a turned-off state, the detection circuit is in an initial state, and a controller 1 collects a voltage V1 of a positive electrode of a battery pack 2 to a reference potential terminal G1, and a voltage V2 of a negative electrode of a battery pack 2 to the reference potential terminal G, the following equation (6) may be obtained:

$$\frac{V1}{R_P} = \frac{|V2|}{R_N} \quad (6)$$

The controller 1 further judges a magnitude relationship between the voltage V1 of the positive electrode of the battery pack 2 to the reference potential terminal G, and the voltage V2 of the negative electrode of the battery pack 2 to the reference potential terminal G, where, when V2 is a negative value, it is changed to an absolute value; and there may be two cases below.

(1) The controller 1 selects the positive electrode of the battery pack 2 as the target electrode when V1>|V2|, turns on the detection switch S3 of the detection loop 3 connected with the positive electrode of the battery pack 2, and re-collects a voltage V1' of the positive electrode of the battery pack 2 to the reference potential terminal G and a voltage V2' of the negative electrode of the battery pack 2 to the reference potential terminal G. The following equation (7) may be obtained:

$$\frac{V1'}{\frac{R_P \times R1}{R_P + R1}} = \frac{|V2'|}{R_N} \quad (7)$$

The controller 1 further combines Equation (6) and Equation (7) as described above to obtain a system of equations, into which the resistance value of a detection resistor R1, as well as the collected values of V1, V2, V1' and V2' herein substituted, and determines resistance values of an insulation resistor $R_P$ and an insulation resistor $R_N$.

(2) The controller 1 selects the negative electrode of the battery pack 2 as the target electrode when V1<|V2|, turns on a detection switch S5 of a detection loop 3 connected with the negative electrode of the battery pack 2, and re-collects a voltage V1″ of the positive electrode of the battery pack 2 to the reference potential terminal G and a voltage V2″ of the negative electrode of the battery pack 2 to the reference potential terminal G. The following equation (8) may be obtained:

$$\frac{V1''}{R_P} = \frac{|V2''|}{\frac{R_N \times R3}{R_N + R3}} \quad (8)$$

The controller 1 further combines Equation (6) and Equation (8) as described above to obtain a system of equations, into which the resistance value of a detection resistor R3, as well as the collected values of V1, V2, V1″ and V2″, and determines the resistance values of an insulation resistor $R_P$ and an insulation resistor $R_N$.

Step 402, whether an insulation fault occurs is judged according to the resistance values of the insulation resistors of the internal sides of the main positive switch module and the main negative switch module. If an insulation fault occurs, the process ends directly. If no insulation fault occurs, step 403 is performed.

Specifically, according to the resistance values of the insulation resistor $R_P$ and the insulation resistor $R_N$, it is judged whether an insulation fault occurs For example, the insulation fault may be a short circuit fault due to an excessively low resistance value, a non-safety fault due to an excessively high resistance value, or the like. When the resistance values of the insulation resistor $R_P$ and the insulation resistor $R_N$ are both within a preset range, it is judged that no insulation fault occurs, the detection circuit is controlled being in the initial state, that is, the main positive switch module S1 or the main negative switch module S2 once turned on is turned off, and then step 403 is performed, i.e. the resistance values of the insulation resistors $R_{P\_EX}$ and $R_{N\_EX}$ are detected, which improves safety. After the controller judges that an insulation fault occurs, the fault is reported to a control system of a whole vehicle. In addition, after the resistance values of the insulation resistors $R_{P\_EX}$ and $R_{N\_EX}$ on the external sides of the main positive switch module S1 and the main negative switch module S2 are detected, it may also be judged whether an insulation fault occurs according to the resistance values of the insulation resistors $R_{P\_EX}$ and $R_{N\_EX}$. The main positive switch module S1 and the main negative switch module S2 are turned on after it is judged that no insulation fault occurs; otherwise, the fault is reported to the control system of the whole vehicle.

Since the above-described embodiment of the detection circuit mutually corresponds to this embodiment, this embodiment may be implemented in mutual cooperation with the above-described embodiment. The related technical details as mentioned in the above-described embodiment are still available in this embodiment, and the technical effects that can be achieved in the above-described embodiment can also be achieved in this embodiment, which will not be described here, in order to reduce repetition. Accordingly, the related technical details as mentioned in this embodiment may also be applied to the above-described embodiment.

In this embodiment, when the internal side of the main positive switch module and/or the internal side of the main negative switch module are/is connected with the reference potential terminal through at least one detection circuit, resistance values of the insulation resistors of the internal sides of the main positive switch module and the main negative switch module may be further detected. It should be noted that, this embodiment may further be taken as an improvement on the basis of any above-described embodiment, and may achieve a same technical effect.

Those ordinarily skilled in the art may understand that, the above-described respective embodiments are specific embodiments for implementing the present disclosure, and in actual application, various changes can be made in forms and details without departing from the spirit and scope of the present disclosure.

What is claimed is:

1. A detection circuit, comprising: a controller, a battery pack, a main positive switch module, a main negative switch module and at least one detection loop; wherein,
    both sides of the main positive switch module and both sides of the main negative switch module are connected with a reference potential terminal respectively, and one side of the main positive switch module and/or one side of the main negative switch module are/is connected with the reference potential terminal through at least one detection loop; a positive electrode of the battery pack is connected with an internal side of the main positive switch module, a negative electrode of the battery pack is connected with an internal side of the main negative switch module;
    the controller is configured to turn on the main positive switch module or the main negative switch module when the detection circuit is in an initial state, collect voltages of the positive electrode and the negative electrode of the battery pack and a voltage between an external side of the main positive switch module and an external side of the main negative switch module, and re-collect voltages of the positive electrode and the negative electrode of the battery pack and a voltage between the external side of the main positive switch module and the external side of the main negative switch module after turning on any one of the detection loops; wherein, the initial state is a state in which the main positive switch module, the main negative switch module, and the respective detection loops are all in a turned-off state; and
    the controller is further configured to obtain resistance values of insulation resistors of the external sides of the main positive switch module and the main negative switch module, according to resistance values of insulation resistors of the internal sides of the main positive switch module and the main negative switch module, as well as the voltages of the positive electrode and the negative electrode of the battery pack and the voltage between the external side of the main positive switch module and the external side of the main negative switch module, which are collected twice.

2. The detection circuit according to claim 1, wherein, the detection circuit further comprises: a pre-charge module, which is connected in parallel with the main positive switch module or the main negative switch module;
    the controller is specifically configured to turn on any one of the main positive switch module, the main negative switch module and the pre-charge module when the detection circuit is in the initial state, collect the voltages of the positive electrode and the negative electrode of the battery pack and the voltage between the external side of the main positive switch module and the external side of the main negative switch module, and re-collect the voltages of the positive electrode and the negative electrode of the battery pack and the voltage between the external side of the main positive switch module and the external side of the main negative switch module after turning on any one of the detection loops.

3. The detection circuit according to claim 1, wherein, the internal side of the main positive switch module and the internal side of the main negative switch module are respectively connected with the reference potential terminal through the at least one detection loop;
the controller is configured to turn on the main positive switch module or the main negative switch module when the detection circuit is in the initial state, collect the voltages of the positive electrode and the negative electrode of the battery pack and the voltage between the external side of the main positive switch module and the external side of the main negative switch module, and select an electrode with a larger voltage from the positive electrode and the negative electrode of the battery pack to be as a target electrode; and
the controller is further configured to re-collect the voltages of the positive electrode and the negative electrode of the battery pack and the voltage between the external side of the main positive switch module and the external side of the main negative switch module after turning on the detection loop connected with the target electrode.

4. The detection circuit according to claim 1, wherein, the internal side of the main positive switch module and/or the internal side of the main negative switch module are/is connected with the reference potential terminal through the at least one detection loop;
the controller is further configured to collect the voltages of the positive electrode and the negative electrode of the battery pack when the detection circuit is in the initial state, re-collect the voltages of the positive electrode and the negative electrode of the battery pack after turning on any one of the detection loops, and obtain the resistance values of the insulation resistors of the internal sides of the main positive switch module and the main negative switch module according to the voltages of the positive electrode and the negative electrode of the battery pack, which are collected twice.

5. The detection circuit according to claim 4, wherein, the controller is further configured to judge whether an insulation fault occurs, according to the resistance values of the insulation resistors of the internal sides of the main positive switch module and the main negative switch module;
the controller is further configured to control the detection circuit being in the initial state when it is determined that no insulation fault occurs, turn on the main positive switch module or the main negative switch module, collect the voltages of the positive electrode and the negative electrode of the battery pack, and the voltage between the external side of the main positive switch module and the external side of the main negative switch module, and re-collect the voltages of the positive electrode and the negative electrode of the battery pack and the voltage between the external side of the main positive switch module and the external side of the main negative switch module after turning on any one of the detection loops.

6. The detection circuit according to claim 4, wherein, the internal side of the main positive switch module and the internal side of the main negative switch module are respectively connected with the reference potential terminal through the at least one detection loop;
the controller is configured to collect the voltages of the positive electrode and the negative electrode of the battery pack when the detection circuit is in the initial state, and select an electrode with a larger voltage from the positive electrode and the negative electrode of the battery pack to be as the target electrode; and
the controller is further configured to re-collect the voltages of the positive electrode and the negative electrode of the battery pack after turning on the detection loop connected with the target electrode, and obtain resistance values of the insulation resistors of the internal sides of the main positive switch module and the main negative switch module according to the voltages of the positive electrode and the negative electrode of the battery pack, which are collected twice.

7. The detection circuit according to claim 1, wherein, the detection loop includes a detection switch and a detection resistor.

8. The detection circuit according to claim 2, wherein, the pre-charge module includes a pre-charge contactor and a pre-charge resistor.

9. A detection method, applied to a detection circuit comprising:
a controller, a battery pack, a main positive switch module, a main negative switch module and at least one detection loop;
wherein, both sides of the main positive switch module and both sides of the main negative switch module are connected with a reference potential terminal respectively, and one side of the main positive switch module and/or one side of the main negative switch module are/is connected with the reference potential terminal through at least one detection loop;
a positive electrode of the battery pack is connected with an internal side of the main positive switch module, a negative electrode of the battery pack is connected with an internal side of the main negative switch module; and
the method comprising:
turning on, by the controller, a main positive switch module or a main negative switch module when the detection circuit is in an initial state;
collecting, by the controller, voltages of a positive electrode and a negative electrode of a battery pack and a voltage between an external side of the main positive switch module and an external side of the main negative switch module, wherein, the initial state is a state in which the main positive switch module, the main negative switch module and the respective detection loops are all in a turned-off state;
turning on, by the controller, any one of the detection loops;
re-collecting, by the controller, voltages of the positive electrode and the negative electrode of the battery pack and a voltage between the external side of the main positive switch module and the external side of the main negative switch module; and
obtaining, by the controller, resistance values of insulation resistors of the external sides of the main positive switch module and the main negative switch module, according to resistance values of insulation resistors of internal sides of the main positive switch module and the main negative switch module, as well as the voltages of the positive electrode and the negative electrode of the battery pack and the voltage between the external side of the main positive switch module and the external side of the main negative switch module, which are collected twice.

10. The detection method according to claim 9, wherein: the step of turning on, by the controller, a main positive switch module or a main negative switch module when the detection circuit is in an initial state, collecting, by the controller, voltages of a positive electrode and a negative electrode of a battery pack and a voltage between an external side of the main positive switch module and an external side of the main negative switch module, is specifically:
- turning on, by the controller, any one of the main positive switch module, the main negative switch module and a pre-charge module when the detection circuit is in the initial state, and
- collecting, by the controller, the voltages of the positive electrode and the negative electrode of the battery pack and the voltage between the external side of the main positive switch module and the external side of the main negative switch module;
- wherein, the pre-charge module is included in the detection circuit, and the pre-charge module is connected in parallel with the main positive switch module or the main negative switch module.

11. The detection method according to claim 9, wherein: before the step of turning on, by the controller, any one of the detection loops, re-collecting, by the controller, voltages of the positive electrode and the negative electrode of the battery pack and a voltage between the external side of the main positive switch module and the external side of the main negative switch module, the method further comprises:
- selecting, by the controller, an electrode with a larger voltage from the positive electrode and the negative electrode of the battery pack to be as a target electrode;
- the step of turning on, by the controller, any one of the detection loops, re-collecting, by the controller, voltages of the positive electrode and the negative electrode of the battery pack and a voltage between the external side of the main positive switch module and the external side of the main negative switch module, is specifically:
  - turning on, by the controller, a detection loop connected with the target electrode, and
  - re-collecting, by the controller, voltages of the positive electrode and the negative electrode of the battery pack and a voltage between the external side of the main positive switch module and the external side of the main negative switch module;
- wherein, at least one detection loop is connected between the internal side of the main positive switch module and a reference potential terminal; and at least one detection loop is connected between the internal side of the main negative switch module and a reference potential terminal.

12. The detection method according to claim 9, wherein: before the step of turning on, by the controller, a main positive switch module or a main negative switch module when the detection circuit is in an initial state, collecting, by the controller, voltages of a positive electrode and a negative electrode of a battery pack and a voltage between an external side of the main positive switch module and an external side of the main negative switch module, the method further comprises:
- collecting, by the controller, the voltages of the positive electrode and the negative electrode of the battery pack when the detection circuit is in the initial state;
- re-collecting, by the controller, voltages of the positive electrode and the negative electrode of the battery pack after turning on any one of detection loops, and
- obtaining, by the controller, resistance values of insulation resistors of the internal sides of the main positive switch module and the main negative switch module according to the voltages of the positive electrode and the negative electrode of the battery pack, which are collected twice;
- wherein, at least one detection loop are connected between the internal side of the main positive switch module and/or the internal side of the main negative switch module and the reference potential terminal.

13. The detection method according to claim 12, wherein, before the step of turning on, by the controller, a main positive switch module or a main negative switch module when the detection circuit is in an initial state, collecting, by the controller, voltages of a positive electrode and a negative electrode of a battery pack and a voltage between an external side of the main positive switch module and an external side of the main negative switch module, the method further comprises:
- judging, by the controller, whether an insulation fault occurs according to the resistance values of the insulation resistors of the internal sides of the main positive switch module and the main negative switch module; and
- when it is determined that no insulation fault occurs, controlling, by the controller, the detection circuit to be in the initial state, and proceeding to the step of turning on a main positive switch module or a main negative switch module when the detection circuit is in an initial state, collecting, by the controller, voltages of a positive electrode and a negative electrode of a battery pack and a voltage between an external side of the main positive switch module and an external side of the main negative switch module.

14. The detection method according to claim 12, wherein, the internal side of the main positive switch module and the internal side of the main negative switch module are both connected with the reference potential terminal through the at least one detection loop;
- the step of collecting, by the controller, the voltages of the positive electrode and the negative electrode of the battery pack when the detection circuit is in the initial state, re-collecting, by the controller, voltages of the positive electrode and the negative electrode of the battery pack after turning on any one of the detection loops, and obtaining resistance values of insulation resistors of the internal sides of the main positive switch module and the main negative switch module according to the voltages of the positive electrode and the negative electrode of the battery pack collected twice, comprises:
  - collecting, by the controller, the voltages of the positive electrode and the negative electrode of the battery pack when the detection circuit is in the initial state,
  - selecting, by the controller, an electrode with a larger voltage from the positive electrode and the negative electrode of the battery pack to be as a target electrode;
  - turning on, by the controller, the detection loop connected with the target electrode, re-collecting the voltages of the positive electrode and the negative electrode of the battery pack, and
  - obtaining, by the controller, the resistance values of the insulation resistors of the internal sides of the main positive switch module and the main negative switch module according to the voltages of the positive electrode and the negative electrode of the battery pack, which are collected twice.

* * * * *